(12) United States Patent
Syed Mohammed et al.

(10) Patent No.: US 11,935,678 B2
(45) Date of Patent: Mar. 19, 2024

(54) INDUCTIVE DEVICES AND METHODS OF FABRICATING INDUCTIVE DEVICES

(71) Applicant: GLOBALFOUNDRIES Singapore Pte. Ltd., Singapore (SG)

(72) Inventors: Zishan Ali Syed Mohammed, Singapore (SG); Lulu Peng, Singapore (SG); Chor Shu Cheng, Singapore (SG); Yong Chau Ng, Singapore (SG); Lawrence Selvaraj Susai, Singapore (SG)

(73) Assignee: GLOBALFOUNDARIES SINGAPORE Pte. Ltd., Singapore (SG)

( * ) Notice: Subject to any disclaimer, the term of this patent is extended or adjusted under 35 U.S.C. 154(b) by 555 days.

(21) Appl. No.: 17/117,258

(22) Filed: Dec. 10, 2020

(65) Prior Publication Data

US 2022/0189673 A1 Jun. 16, 2022

(51) Int. Cl.
*H01F 27/28* (2006.01)
*H01F 17/00* (2006.01)
*H01F 27/02* (2006.01)
*H01L 49/02* (2006.01)

(52) U.S. Cl.
CPC ....... *H01F 17/0013* (2013.01); *H01F 27/022* (2013.01); *H01F 27/28* (2013.01); *H01L 28/10* (2013.01)

(58) Field of Classification Search
CPC .... H01F 17/0013; H01F 27/022; H01F 27/28; H01F 3/14; H01F 17/0033; H01F 27/306; H01F 41/06; H01L 28/10

USPC .......................................... 336/90, 221, 212
See application file for complete search history.

(56) References Cited

U.S. PATENT DOCUMENTS

| | | | |
|---|---|---|---|
| 6,459,351 B1* | 10/2002 | Maki | H01F 27/2804 336/200 |
| 6,529,110 B2* | 3/2003 | Fedeli | H01F 3/14 336/200 |
| 9,640,604 B2 | 5/2017 | Chen | |
| 10,541,297 B2 | 1/2020 | Lee et al. | |
| 2014/0097927 A1* | 4/2014 | Yamamoto | H01F 27/255 336/200 |
| 2018/0108475 A1* | 4/2018 | Hamada | H01F 17/00 |
| 2022/0375679 A1* | 11/2022 | Takeuchi | H01F 27/323 |

OTHER PUBLICATIONS

Lambert et al., "Study of Thin-Film Magnetic Inductors Applied to Integrated Voltage Regulators", IEEE Transactions on Power Electronics, Jun. 2020, pp. 6208-6220, vol. 35, No. 6, IEEE.

* cited by examiner

*Primary Examiner* — Shawki S Ismail
*Assistant Examiner* — Kazi S Hossain
(74) *Attorney, Agent, or Firm* — VIERING JENTSCHURA & PARTNER MBB

(57) ABSTRACT

An inductive device may be provided, including a first winding layer, a second winding layer arranged over the first winding layer and connected to the first winding layer to form a plurality of turns around a first axis, and a magnetic core arranged vertically between the first winding layer and the second winding layer. The magnetic core may include a portion entirely over the first winding layer and entirely under the second winding layer, where this portion may include a magnetic segment and a non-magnetic segment arranged laterally adjacent to each other along the first axis.

16 Claims, 12 Drawing Sheets

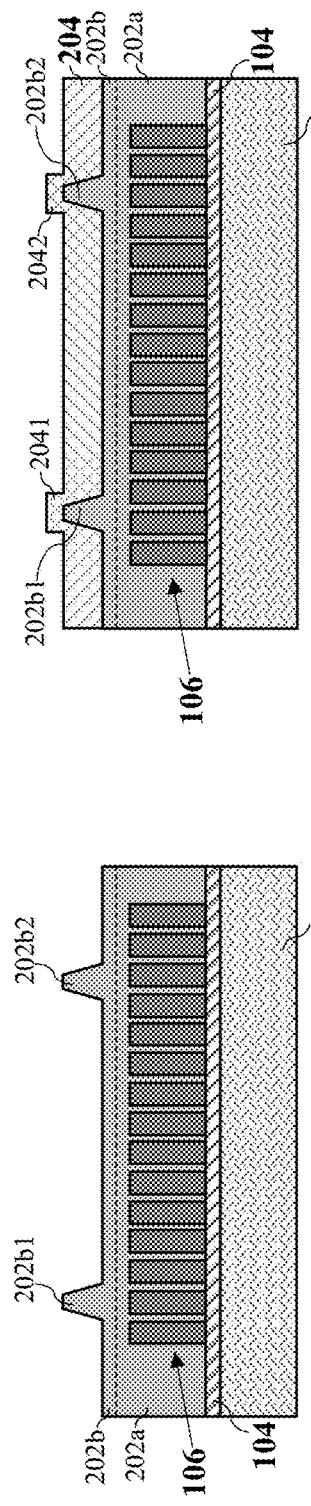
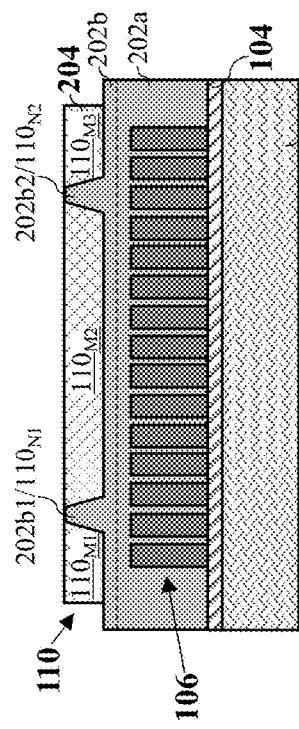
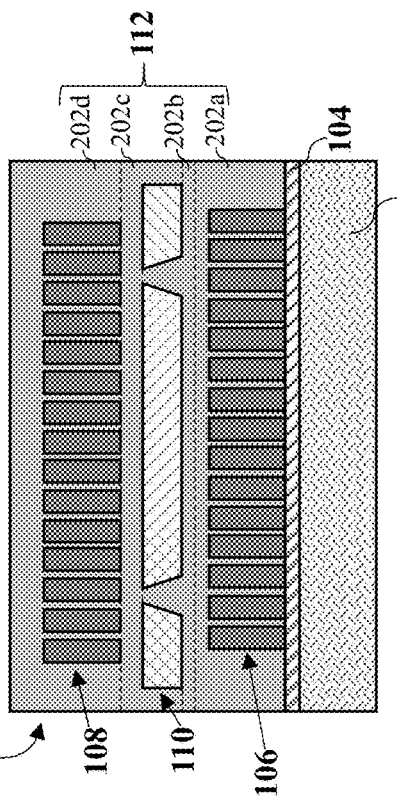
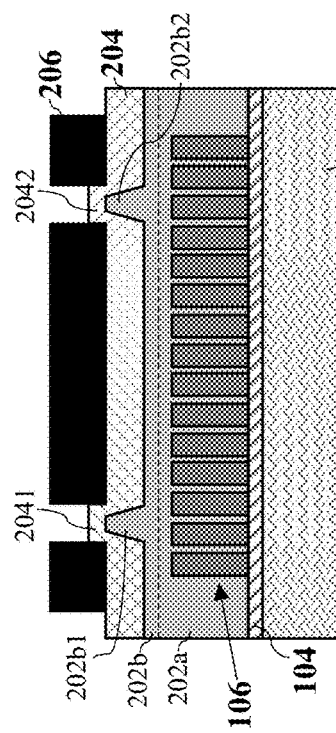
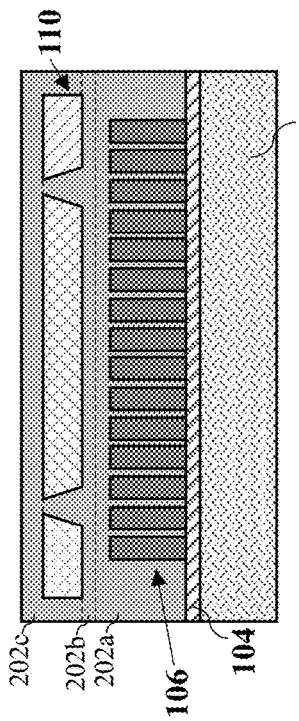

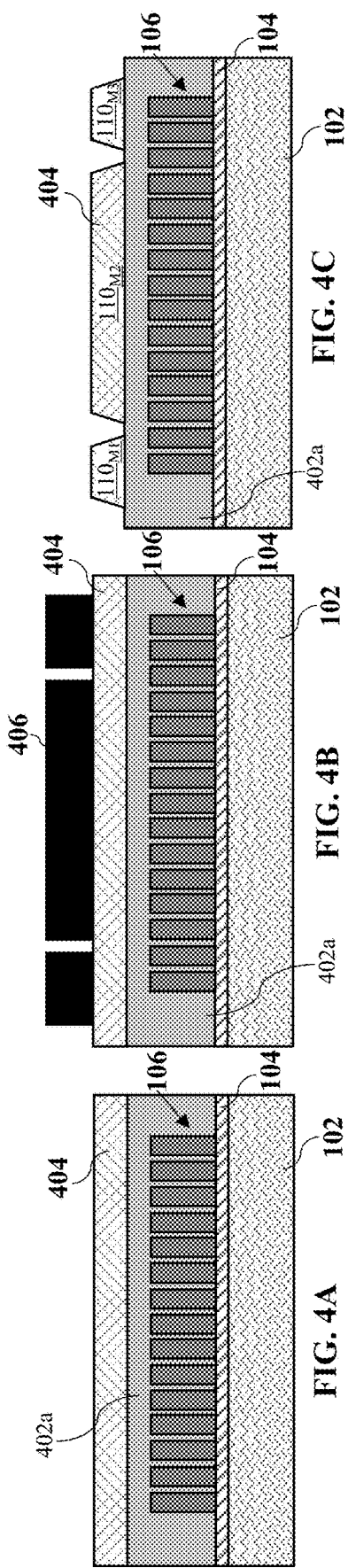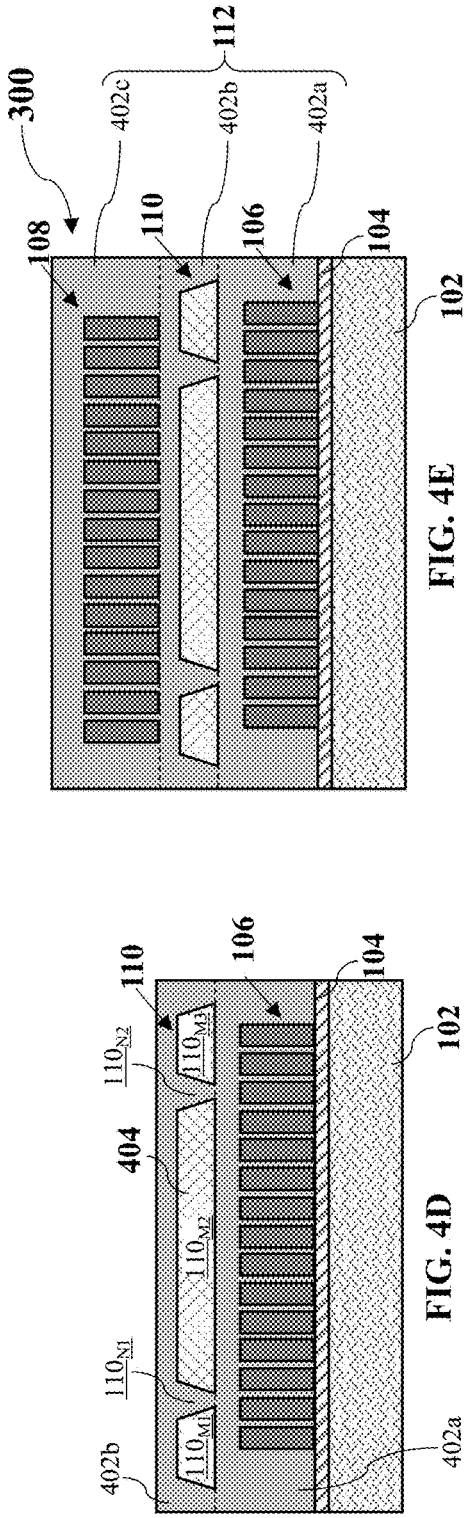

INDUCTIVE DEVICES AND METHODS OF FABRICATING INDUCTIVE DEVICES

TECHNICAL FIELD

The present disclosure relates generally to inductive devices, and methods of fabricating the inductive devices.

BACKGROUND

Several electrical appliances include integrated voltage regulators (IVRs), for example, IVRs having direct current-direct current (DC-DC) buck convertors that supply power to central processing units (CPUs). These IVRs generally operate in a high frequency range and with high operating currents, so as to supply sufficiently high currents for efficient power delivery to the multi-core CPUs. Thus, the IVRs often utilize on-board non-magnetic inductive devices capable of handling such operating currents. However, these inductive devices are often bulky and occupy large areas on the boards, as a high number of turns is usually required in the devices to provide a sufficiently high inductance density (similar to that that can be provided by magnetic inductive devices). They also tend to have low inductance densities and low Q factors. At present, there are on-board magnetic inductive devices including ferrite material as cores. However, these inductive devices tend to display high losses in the high frequency range and saturate quickly at high operating currents. Therefore, they are generally used for DC-DC convertors operating in a low frequency range but not for the IVRs operating in a high frequency range. Thus, the IVRs are often large in size and display problems such as high losses.

Accordingly, on-board non-magnetic inductive devices in IVRs are gradually replaced with on-chip magnetic inductive devices. This may help reduce the sizes of the IVRs, and improve the performance of the IVRs in terms of their losses, inductance densities and Q factors. However, the problem of magnetic core saturation at high operating currents occurs when using on-chip magnetic inductive devices. A current solution to this problem is to use larger on-chip magnetic inductive devices as the saturation currents (in other words, currents at which magnetic core saturation occurs) of these devices are generally higher. However, such magnetic inductive devices are not only larger, they also have lower inductance densities. This thus defeats the purpose of replacing the on-board non-magnetic inductive devices with on-chip magnetic inductive devices.

Therefore, it is desirable to provide a magnetic inductive device with a higher saturation current and with a relatively small size.

SUMMARY

According to various non-limiting embodiments, there may be provided an inductive device including: a first winding layer; a second winding layer arranged over the first winding layer and connected to the first winding layer to form a plurality of turns around a first axis; and a magnetic core arranged vertically between the first winding layer and the second winding layer, where the magnetic core may include a portion entirely over the first winding layer and entirely under the second winding layer, and where the portion of the magnetic core may include a magnetic segment and a non-magnetic segment arranged laterally adjacent to each other along the first axis.

According to various non-limiting embodiments, there may be provided a method of fabricating an inductive device. The method may include forming a first winding layer; forming a second winding layer over the first winding layer, where the second winding layer may be connected to the first winding layer to form a plurality of turns around a first axis; and forming a magnetic core vertically between the first winding layer and the second winding layer, where the magnetic core may include a portion entirely over the first winding layer and entirely under the second winding layer, and where the portion of the magnetic core may include a magnetic segment and a non-magnetic segment arranged laterally adjacent to each other along the first axis.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 2A to 2F show simplified cross-sectional views illustrating a method of fabricating the inductive device of FIGS. 1A and 1B according to various non-limiting embodiments;

FIGS. 4A to 4E show simplified cross-sectional views illustrating a method of fabricating the inductive device of FIG. 3 according to various non-limiting embodiments;

DETAILED DESCRIPTION

Figure 1A:
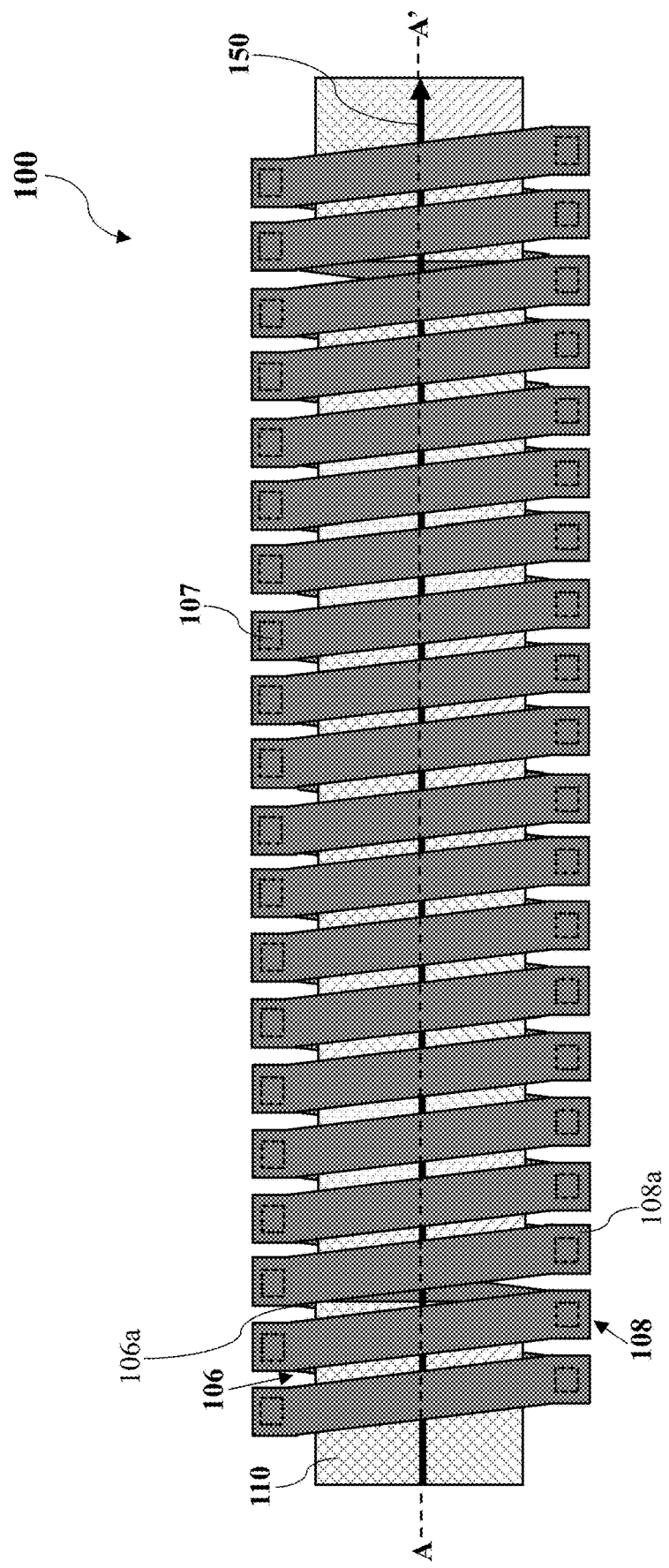
FIG. 1A and FIG. 1B respectively shows a simplified top view and a simplified cross-sectional view of an inductive device according to various non-limiting embodiments.

The embodiments generally relate to semiconductor devices. More particularly, some embodiments relate to inductive devices. The inductive devices may be magnetic inductive devices and may be used for various applications, for instance, power conversion. For example, the inductive devices may be used as on-chip magnetic inductive devices for DC-DC voltage conversion and may be integrated in the far back-end-of-line (far-BEOL) of power management integrated circuits (PMICs) such as, but not limited to, IVRs. The inductive devices may also be used in transformers for stepping up and stepping down voltages, or for isolation.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
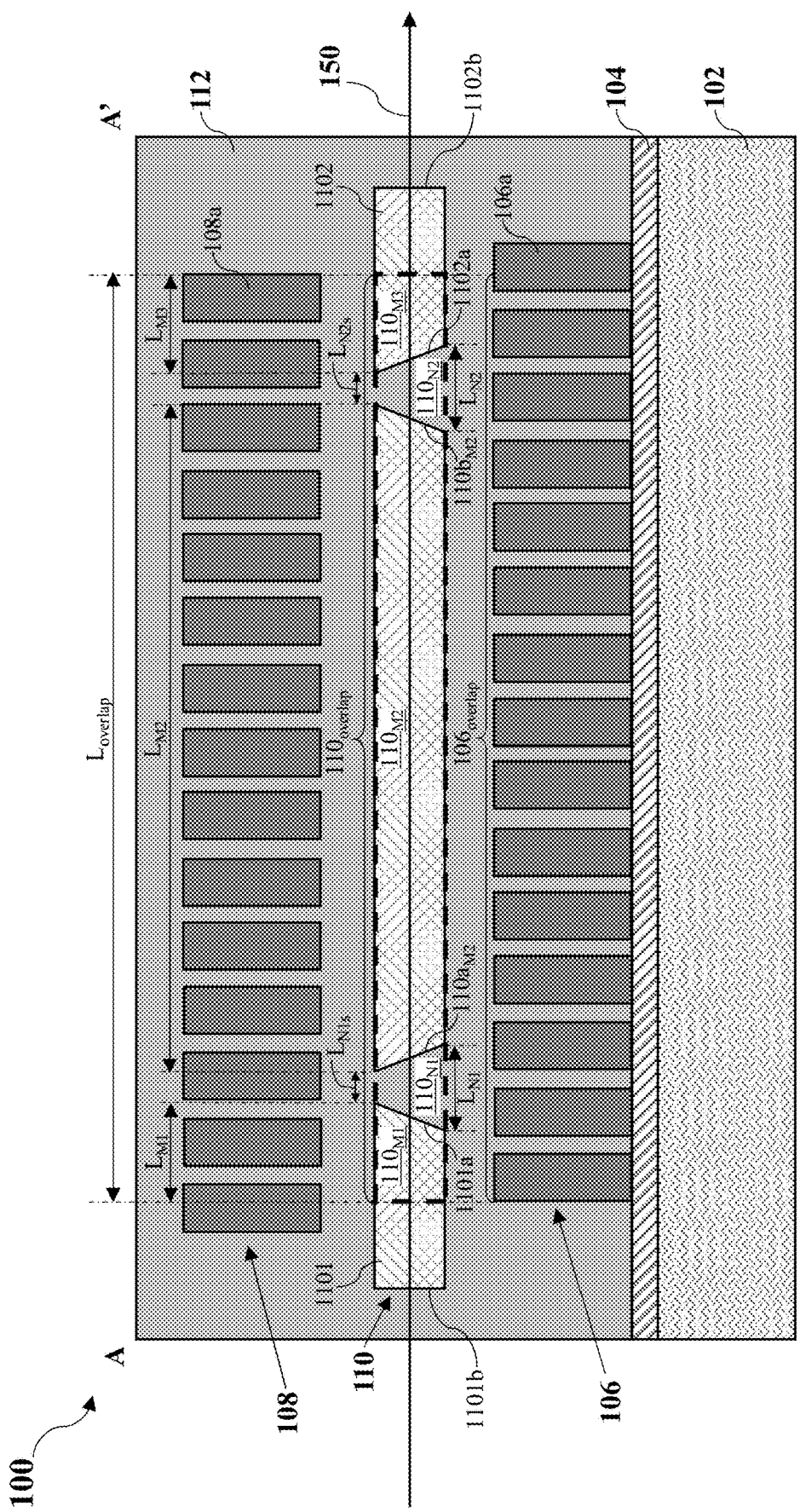

FIG. 1A shows a simplified top view of an inductive device 100 according to various non-limiting embodiments, and FIG. 1B shows a simplified cross-sectional view of the inductive device 100 along the line A-A' of FIG. 1A. The inductive device 100 may be a magnetic inductive device.

Referring to FIG. 1B, the inductive device 100 may include a substrate 102. The substrate 102 may be a semiconductor substrate. For example, the substrate 102 may include semiconductor material, such as, but not limited to, silicon (Si), germanium (Ge), silicon carbide (SiC), or combinations thereof.

The inductive device 100 may also include a first insulating layer 104 arranged over the substrate 102. The first insulating layer 104 may include an insulating material, for example, a dielectric material such as, but not limited to, silicon nitride, silicon oxide, or combinations thereof.

Referring to FIGS. 1A and 1B, the inductive device 100 may further include a first winding layer 106 arranged over the first insulating layer 104, and a second winding layer 108 arranged over the first winding layer 106. The first winding layer 106 may include a plurality of first winding segments 106a arranged laterally adjacent to each other, where a gap may be arranged between each pair of adjacent first winding segments 106a. Similarly, the second winding layer 108 may include a plurality of second winding segments 108a arranged laterally adjacent to each other, where a gap may be arranged between each pair of adjacent second winding segments 108a. To avoid cluttering the figures, only one of the first winding segments 106a and one of the second winding segments 108a are labelled in FIGS. 1A and 1B. As shown in FIG. 1B, the first winding layer 106 and the second winding layer 108 may be laterally offset from each other, and the first winding layer 106 may include an overlap segment $106_{overlap}$ overlapping vertically with the second winding layer 108. As shown in FIG. 1A, the inductive device 100 may further include a plurality of connectors 107 vertically between (and connecting) the first winding layer 106 and the second winding layer 108 to form a plurality of turns around a first axis 150. Similarly, only one of the connectors 107 is labelled in FIG. 1A to avoid cluttering the figure. Each of the first winding segments 106a, second winding segments 108a and connectors 107 may include electrically conductive material, such as, but not limited to, copper.

As shown in FIGS. 1A and 1B, the inductive device 100 may further include a magnetic core 110 arranged vertically between the first winding layer 106 and the second winding layer 108. The magnetic core 110 may include a portion $110_{overlap}$ extending along the first axis 150 and fully overlapping with an entire length $L_{overlap}$ of the overlap segment $106_{overlap}$ of the first winding layer 106. In other words, the portion $110_{overlap}$ may be entirely over the first winding layer 106 and entirely under the second winding layer 108.

The magnetic core 110 may be a segmented magnetic core. As more clearly shown in FIG. 1B, the portion $110_{overlap}$ of the magnetic core 110 may include a magnetic segment (first magnetic segment $110_{M1}$) and a further magnetic segment (third magnetic segment $110_{M3}$) arranged at respective ends of the portion $110_{overlap}$ along the first axis 150. The portion $110_{overlap}$ of the magnetic core 110 may also include a second magnetic segment $110_{M2}$, and first and second non-magnetic segments $110_{N1}$, $110_{N2}$. The first non-magnetic segment $110_{N1}$ may be arranged laterally between the first magnetic segment $110_{M1}$ and the second magnetic segment $110_{M2}$; whereas, the second non-magnetic segment $110_{N2}$ may be arranged laterally between the second magnetic segment $110_{M2}$ and the third magnetic segment $110_{M3}$. Each of the magnetic segment $110_{M1}$, $110_{M3}$ at each end of the portion $110_{overlap}$ may be at least a part of a magnetic element 1101, 1102. For example, as shown in FIG. 1B, the first magnetic segment $110_{M1}$ may be a part of the magnetic element 1101; whereas, the third magnetic segment $110_{M3}$ may be a part of the magnetic element 1102. The magnetic elements 1101, 1102 may each extend laterally beyond the overlap segment $106_{overlap}$ of the first winding layer 106 (in other words, extend laterally beyond the portion $110_{overlap}$ of the magnetic core 110).

Further, as shown in FIG. 1B, each magnetic segment $110_{M1}$, $110_{M2}$, $110_{M3}$ may include at least one side surface 1101a, $110a_{M2}$, $110b_{M2}$, 1102a slanted at an angle relative to the first axis 150. For example, the second magnetic segment $110_{M2}$ may include a first side surface $110a_{M2}$ and a second side surface $110b_{M2}$ (opposite to the first side surface $110a_{M2}$) slanted in opposite directions relative to the first axis 150. Accordingly, the second magnetic segment $110_{M2}$ may have a trapezoidal cross-section. Each of the magnetic elements 1101, 1102 may also include a first side surface 1101a, 1102a and a second side surface 1101b, 1102b (opposite to the first side surface 1101a, 1102b). As shown in FIG. 1B, the first side surface 1101a, 1102a of each magnetic element 1101, 1102 may be slanted at an angle relative to the first axis 150 (with the side surface 1101a slanted in an opposite direction from the side surfaces $110a_{M2}$, 1102a). On the other hand, the second side surface 1101b, 1102b of each magnetic element 1101, 1102 may be substantially perpendicular to the first axis 150.

As shown in FIG. 1B, a length $L_{M2}$ (in other words, a maximum dimension along the axis 150) of the second magnetic segment $110_{M2}$ may be greater than a length $L_{M1}$ $L_{M3}$ of each of the first magnetic segment $110_{M1}$ and the third magnetic segment $110_{M3}$. In addition, a length $L_{M1}$, $L_{M2}$, $L_{M3}$ of each of the first magnetic segment $110_{M1}$, the second magnetic segment $110_{M2}$ and the third magnetic segment $110_{M3}$ may be greater than a length $L_{N1}$, $L_{N2}$ of each of the first non-magnetic segment $110_{N1}$ and the second non-magnetic segment $110_{N2}$. The lengths $L_{M1}$, $L_{M3}$ of the first and third magnetic segments $110_{M1}$, $110_{M3}$ may be approximately equal and may each range from about 100 μm to about 2 Mm. The length $L_{M2}$ of the second magnetic segment $110_{M2}$ may range from about 100 μm to about 2 mm. The lengths $L_{M1}$, $L_{M2}$, $L_{M3}$ may be adjusted to vary the inductance density and saturation current of the inductive device 100. In various non-limiting embodiments, the inductive device 100 may be used for forming a coupled inductor. In these embodiments, the lengths $L_{M1}$, $L_{M3}$ of the first and third magnetic segments $110_{M1}$, $110_{M3}$ may, in combination, be less than 20% of the length $L_{overlap}$ and these magnetic segments $110_{M1}$, $110_{M3}$ may be arranged under the uncoupled turns, so as to obtain an acceptable trade-off between the coupling coefficient K, the inductance density and the saturation current of the coupled inductor. The lengths $L_{N1}$, $L_{N2}$ of the first and second non-magnetic segments $110_{N1}$, $110_{N2}$ may be approximately equal and may each range from about 20 um to about 40 um. Further, a minimum dimension $L_{N1s}$, $L_{N2s}$ of each of the non-magnetic segments $110_{N1}$, $110_{N2}$ along the first axis 150 may range from about 10 um to about 30 um. In a non-limiting embodiment, the lengths $L_{N1}$, $L_{N2}$ may each be about 30 um and the lengths $L_{N1s}$, $L_{N2s}$ may each be about 20 um.

The magnetic element 1101 (including the first magnetic segment $110_{M1}$), the magnetic element 1102 (including the third magnetic segment $110_{M3}$) and the second magnetic segment $110_{M2}$ may each include a material that may allow the inductive device 100 to operate with a low loss in a high frequency range (for instance, the frequency range up to 100 MHz in which IVRs generally operate). For example, the magnetic elements 1101, 1102 and the second magnetic segment $110_{M2}$ may each include an amorphous soft magnetic material, for example alloys, such as, but not limited to, cobalt zirconium tantalum (CZT) or other cobalt-based alloys. In some non-limiting embodiments, the magnetic elements 1101, 1102 and the second magnetic segment $110_{M2}$ may each have a laminated structure including alternating layers of magnetic and non-magnetic materials along a vertical axis substantially perpendicular to the first axis 150, where the non-magnetic materials may also be electrically insulating materials. For example, the laminated structure may include alternating layers of amorphous soft magnetic alloys (e.g. cobalt-based alloys) and dielectric materials (e.g. oxide such as, but not limited to, metal oxide (e.g. cobalt oxide, aluminum oxide, silicon oxide), nitride or combinations thereof) along the vertical axis. The first and second non-magnetic segments $110_{N1}$, $110_{N2}$ may each include a non-magnetic material for example, a dielectric material, such as, but not limited to, photosensitive polyimide (PSPI), polyphenylene oxide (PPO), or combinations thereof. In some non-limiting embodiments, the first and second non-magnetic segments $110_{N1}$, $110_{N2}$ may be air gaps between the adjacent magnetic segments $110_{M1}$, $110_{M2}$, $110_{M3}$.

As shown in FIG. 1B, the inductive device 100 may further include a second insulating layer 112 arranged over the first insulating layer 104. The second insulating layer 112 may include an insulating material, such as, but not limited to, PSPI. The first winding layer 106, the magnetic core 110 and the second winding layer 108 may be arranged within the second insulating layer 112. In other words, a part of the insulating material of the second insulating layer 112 may be arranged between adjacent first winding segments 106a and between adjacent second winding segments 108a. In various non-limiting embodiments, the non-magnetic segments $110_{N1}$, $110_{N2}$ and the second insulating layer 112 may have a same material composition. However, the non-magnetic segments $110_{N1}$, $110_{N2}$ and the second insulating layer 112 may alternatively have different material compositions.

FIGS. 2A to 2F show simplified cross-sectional views illustrating a method for fabricating the inductive device 100 according to various non-limiting embodiments. For clarity of illustration, some reference numerals have been omitted from FIGS. 2A to 2F.

Referring to FIG. 2A, the method may include providing the substrate 102 and forming the first insulating layer 104 over the substrate 102. The method may further include forming the first winding layer 106 over the first insulating layer 104. The first winding layer 106 may be formed by any process as known to those skilled in the art. For example, the first winding layer 106 may be formed by electroplating electrically conductive material over the first insulating layer 104, or by depositing electrically conductive material over the first insulating layer 104 and etching this material. A first insulating portion 202a may then be formed over the first insulating layer 104, such that the first winding layer 106 may be arranged within this first insulating portion 202a. The first insulating portion 202a may be formed by spin-coating a blanket layer of insulating material over the first insulating layer 104, and curing this insulating material. As shown in FIG. 2A, the method may further include forming a second insulating portion 202b over the first winding layer 106, where this second insulating portion 202b may include a first protruding element 202b1 and a second protruding element 202b2 extending away from the first winding layer 106. These protruding elements 202b1, 202b2 may be referred to as spacers or pillars. The second insulating portion 202b may be formed by spin coating another layer of insulating material over the first insulating portion 202a, and performing a lithography process and an etching process on the insulating material.

Referring to FIGS. 2B to 2E, the method may further include forming the magnetic core 110, which begins with forming a magnetic material layer 204 over the second insulating portion 202b as shown in FIG. 2B. The magnetic material layer 204 may be formed by depositing magnetic material over the second insulating portion 202b using a physical vapour deposition (PVD) process. For example, the magnetic material layer 204 may be a laminated structure that may be formed by alternately depositing a magnetic material and a non-magnetic material using PVD over the second insulating portion 202b. As shown in FIG. 2B, the magnetic material layer 204 may include a first protruding member 2041 and a second protruding member 2042 respectively over the first protruding element 202b1 and the second protruding element 202b2 of the second insulating portion 202b.

As shown in FIG. 2C, the method may further include forming a photoresist layer 206 over the magnetic material layer 204, where the photoresist layer 206 may be narrower than the magnetic material layer 204, and may include a first opening over the first protruding member 2041 and a second opening over the second protruding member 2042. Accordingly, the first protruding member 2041, the second protruding member 2042 and a portion at each end of the magnetic material layer 204 may be exposed.

As shown in FIG. 2D, the method may include forming the magnetic core 110. This may be done by patterning the magnetic material layer 204. For instance, the exposed first protruding member 2041, the exposed second protruding member 2042 and the exposed portion at each end of the magnetic material layer 204 may be removed (by for example, etching through the photoresist mask 206). Accordingly, the magnetic segments $110_{M1}$, $110_{M2}$, $110_{M3}$ may be formed from the magnetic material layer 204 and the non-magnetic segments $110_{N1}$, $110_{N2}$ may be formed from the first and second protruding elements 202b1 and 202b2 of the second insulating portion 202b.

As shown in FIG. 2E, the method may further include forming a third insulating portion 202c over the second insulating portion 202b by, for example, spin-coating a layer of insulating material over the second insulating portion 202b.

As shown in FIG. 2F, the method may further include forming the second winding layer 108 over the third insulating portion 202c. The second winding layer 108 may be formed by electroplating electrically conductive material over the third insulating portion 202c, or by depositing and then etching electrically conductive material over the third insulating portion 202c. Further, as shown in FIG. 2F, the method may include forming a fourth insulating portion 202d over the third insulating portion 202c, such that the second winding layer 108 may be arranged within the fourth insulating portion 202d. The fourth insulating portion 202d may be formed by spin-coating a layer of insulating material over the third insulating portion 202c. As shown in FIG. 2F, the first, second, third and fourth insulating portions 202a, 202b, 202c, 202d may form the second insulating layer 112.

The above described order for the method is only intended to be illustrative, and the method is not limited to the above specifically described order unless otherwise specifically stated.

Figure 3:
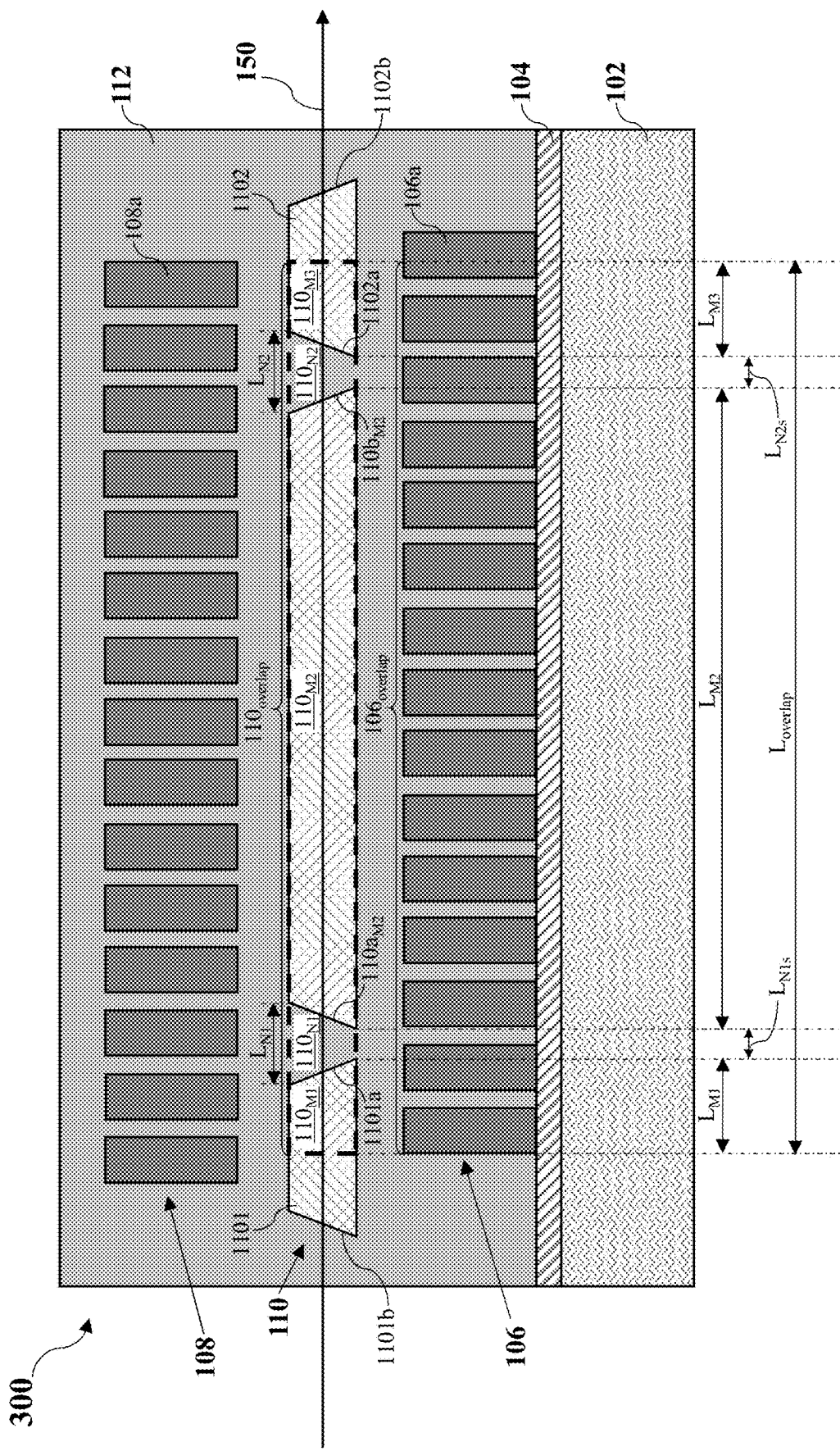
FIG. 3 shows a simplified cross-sectional view of an inductive device according to alternative non-limiting embodiments.

FIG. 3 shows a simplified cross-sectional view of an inductive device 300 according to alternative non-limiting embodiments. The inductive device 300 may be similar to the inductive device 100, and thus, the common features are labelled with the same reference numerals and need not be discussed.

As shown in FIG. 3, the second magnetic segment $110_{M2}$ in the inductive device 300 may also include first and second side surfaces $110a_{M2}$, $110b_{M2}$ slanted at an angle relative to the first axis 150, but the direction of the slant for each side surface $110a_{M2}$, $110b_{M2}$ may be opposite from that in the inductive device 100. Further, as shown in FIG. 3, in the inductive device 300, the magnetic core 110 may also include a magnetic segment (first magnetic segment $110_{M1}$) and a further magnetic segment (third magnetic segment $110_{M3}$) arranged at respective ends of the portion $110_{overlap}$ along the first axis 150. Each of these magnetic segments $110_{M1}$, $110_{M3}$ may also be a part of a magnetic element 1101, 1102. Similar to the magnetic elements 1101, 1102 in the inductive device 100, the first side surface 1101a, 1102a of each magnetic element 1101, 1102 in the inductive device 300 may also be slanted at an angle relative to the first axis 150. However, the slant of these side surfaces 1101a, 1102a may be in an opposite direction from that in the inductive device 100. Further, instead of being substantially perpendicular to the first axis 150, the second side surface 1101b, 1102b of each magnetic element 1101, 1102 in the inductive device 300 may be slanted at an angle relative to the first axis 150. The lengths $L_{M1}$, $L_{M2}$, $L_{M3}$, $L_{N1}$, $L_{N2}$, $L_{N1s}$, $L_{N2s}$ of the magnetic and non-magnetic segments $110_{M1}$, $110_{M2}$, $110_{M3}$, $110_{N1}$, $110_{N2}$ may be similar to those in the inductive device 100.

FIGS. 4A to 4E show simplified cross-sectional views illustrating a method for fabricating the inductive device 300 according to various non-limiting embodiments. For clarity of illustration, some reference numerals have been omitted from FIGS. 4A to 4E.

Referring to FIG. 4A, the method may include providing the substrate 102, forming the first insulating layer 104 over the substrate 102 and forming the first winding layer 106 in a manner similar to that described with reference to FIG. 2A. The method may also include forming a first insulating portion 402a over the first insulating layer 104, and forming a magnetic material layer 404 over the first insulating portion 402a (in other words, over the first winding layer 106). The first insulating portion 402a may be formed by spin-coating a blanket layer of insulating material over the first insulating layer 104, and curing this insulating material. The magnetic material layer 404 may be formed by depositing magnetic material over the first insulating portion 402a using a PVD process similar to that described above for the magnetic material layer 204 in FIG. 2B.

Referring to FIG. 4B, the method may further include forming a photoresist layer 406 over the magnetic material layer 404. The photoresist layer 406 may be formed using a lithography process. The photoresist layer 406 may be narrower than the magnetic material layer 404 and may include openings. Accordingly, segments of the magnetic material layer 404 may be exposed.

Referring to FIG. 4C, the method may further include patterning the magnetic material layer 404 by removing the exposed segments of the layer 404. The magnetic segments $110_{M1}$, $110_{M2}$, $110_{M3}$ of the magnetic core 110 may thus be formed from the magnetic material layer 404. The patterning process may be done by etching the magnetic material layer 404 through the photoresist mask 406. For example, a wet etching process may be used. Alternatively, a dry etching process may be used if the magnetic material layer 404 is sufficiently thin. Using a dry etching process may reduce the angles at which the side surfaces 1101b, 1102b slant relative to the first axis 150.

Referring to FIG. 4D, the method may further include forming a second insulating portion 402b over the magnetic material layer 404, such that a part of the second insulating portion 402b extends between the magnetic segments $110_{M1}$, $110_{M2}$, $110_{M3}$ to form the non-magnetic segments $110_{N1}$, $110_{N2}$ of the magnetic core 110. The second insulating portion 402b may be formed by spin-coating a layer of insulating material over the magnetic material layer 404.

Referring to FIG. 4E, the method may further include forming the second winding layer 108 over the second insulating portion 402b. The second winding layer 108 may be formed by electroplating electrically conductive material over the second insulating portion 402b, or by depositing and then etching electrically conductive material over the second insulating portion 402b. The method may also include forming a third insulating portion 402c over the second insulating portion 402b, such that the second winding layer 108 may be arranged within the third insulating portion 402c. The third insulating portion 402c may be formed by spin-coating a layer of insulating material over the second insulating portion 402b. As shown in FIG. 4E, the first, second and third insulating portions 402a, 402b, 402c may form the second insulating layer 112.

The above described order for the method is only intended to be illustrative, and the method is not limited to the above specifically described order unless otherwise specifically stated.

As compared to the method described with reference to FIGS. 4A to 4E, using the method described with reference to FIGS. 2A to 2F may help to reduce the amount of material removed from the sides of the magnetic material layer 204/404 (in FIG. 2D/4C) due to over-etching. Accordingly, loss in magnetic material during the fabrication process is reduced and the resulting magnetic core 110 may include side surfaces 1101b, 1102b substantially perpendicular to the first axis 150 in FIG. 1B (as opposed to side surfaces 1101b, 1102b slanted at an angle relative to the first axis 150 in FIG. 3).

Figure 5A:
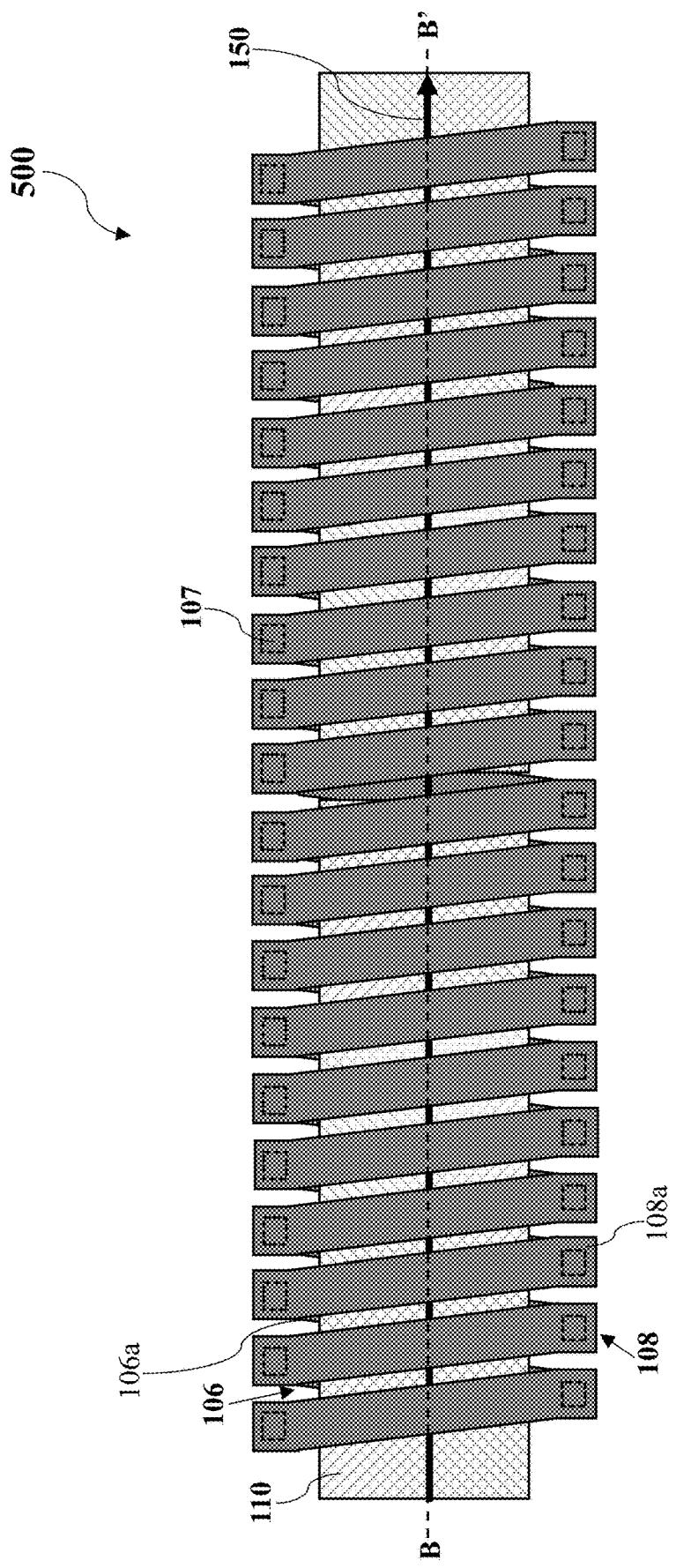
FIG. 5A and FIG. 5B respectively shows a simplified top view and a simplified cross-sectional view of an inductive device according to alternative non-limiting embodiments.
Figure 5B:
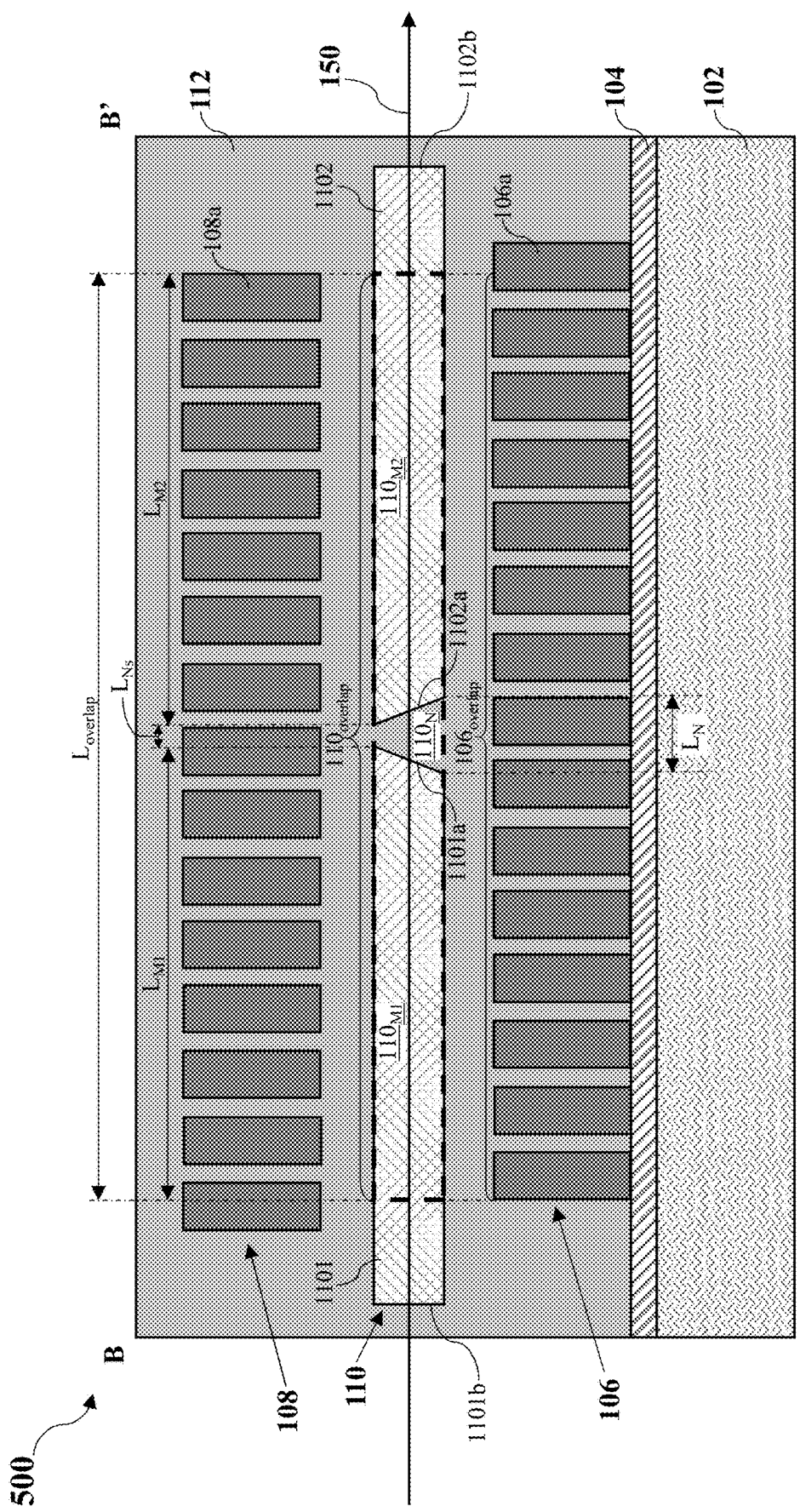

FIG. 5A shows a simplified top view of an inductive device 500 according to alternative non-limiting embodiments, and FIG. 5B shows a simplified cross-sectional view of the inductive device 500 along the line B-B' in FIG. 5A. The inductive device 500 may be similar to the inductive device 100, and thus, the common features are labelled with the same reference numerals and need not be discussed.

As shown in FIG. 5B, similar to the inductive device 100, the magnetic core 110 may also include a magnetic segment (first magnetic segment $110_{M1}$) and a further magnetic segment (second magnetic segment $110_{M2}$) arranged at respective ends of the portion $110_{overlap}$. Each of these segments $110_{M1}$, $110_{M2}$ may also be a part of a magnetic element 1101, 1102 extending laterally beyond the overlap segment $106_{overlap}$ of the first winding layer 106 (in other words, extending laterally beyond the portion $110_{overlap}$ of the magnetic core 110). Further, each magnetic element 1101, 1102 may also have a first side surface 1101a, 1102a slanted at an angle relative to the first axis 150 and a second side surface 1101b, 1102b substantially perpendicular to the first axis 150. However, unlike the inductive device 100, in the inductive device 500, the portion $110_{overlap}$ of the magnetic core 110 may include only two magnetic segments (first and second magnetic segments $110_{M1}$, $110_{M2}$) and a single non-magnetic segment $110_{N}$ arranged laterally therebetween. The non-magnetic segment $110_{N}$ may be arranged to overlap vertically with approximately a middle of the overlap segment $106_{overlap}$ of the first winding layer 106.

As shown in FIG. 5B, a length $L_{M1}$ of the first magnetic segment $110_{M1}$ and a length $L_{M2}$ of the second magnetic segment $110_{M2}$ may be approximately equal and may be greater than a length $L_N$ of the non-magnetic segment $110_N$. For example, the lengths $L_{M1}$, $L_{M2}$ of the first and second magnetic segments $110_{M1}$, $110_{M2}$ may each range from about 100 um to about 2 mm. Similarly, the lengths $L_{M1}$, $L_{M2}$ may be adjusted to vary the inductance density and saturation current of the inductive device 500. When the inductive device 500 is used to form a coupled inductor, the lengths $L_{M1}$, $L_{M2}$ may, in combination, be less than 20% of the length $L_{overlap}$ and these magnetic segments $110_{M1}$, $110_{M3}$ may be arranged under the uncoupled turns, so as to obtain an acceptable trade-off between the coupling coefficient K, the inductance density and the saturation current of the coupled inductor. The length $L_N$ of the non-magnetic segment $110_N$ may range from about 20 um to about 40 um. The minimum dimension $L_{Ns}$ of the non-magnetic segment $110_N$ along the first axis 150 may range from about 10 um to about 30 um. In a non-limiting embodiment, the length $L_N$ may be about 30 um and the length $L_{Ns}$ may be about 20 um.

Figure 6A:
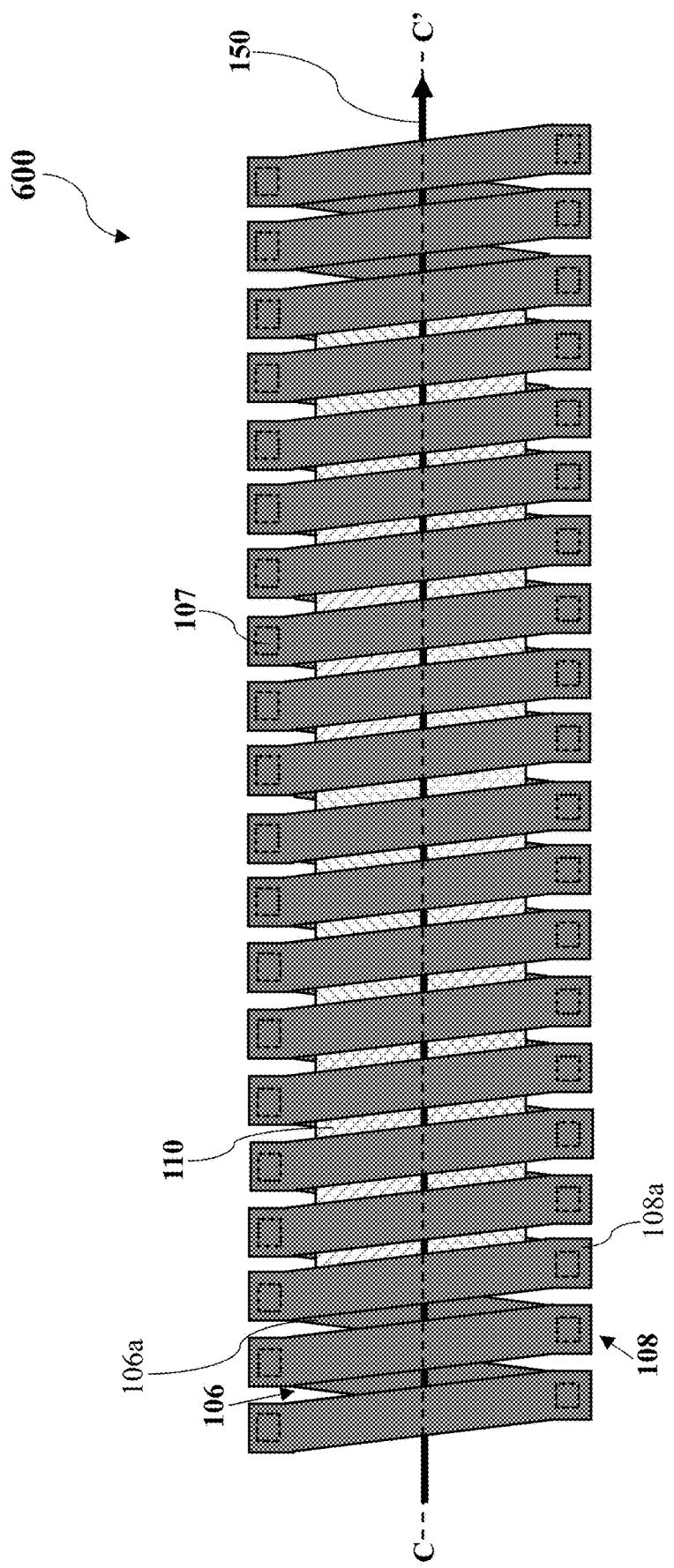
FIG. 6A and FIG. 6B respectively shows a simplified top view and a simplified cross-sectional view of an inductive device according to alternative non-limiting embodiments.
Figure 6B:
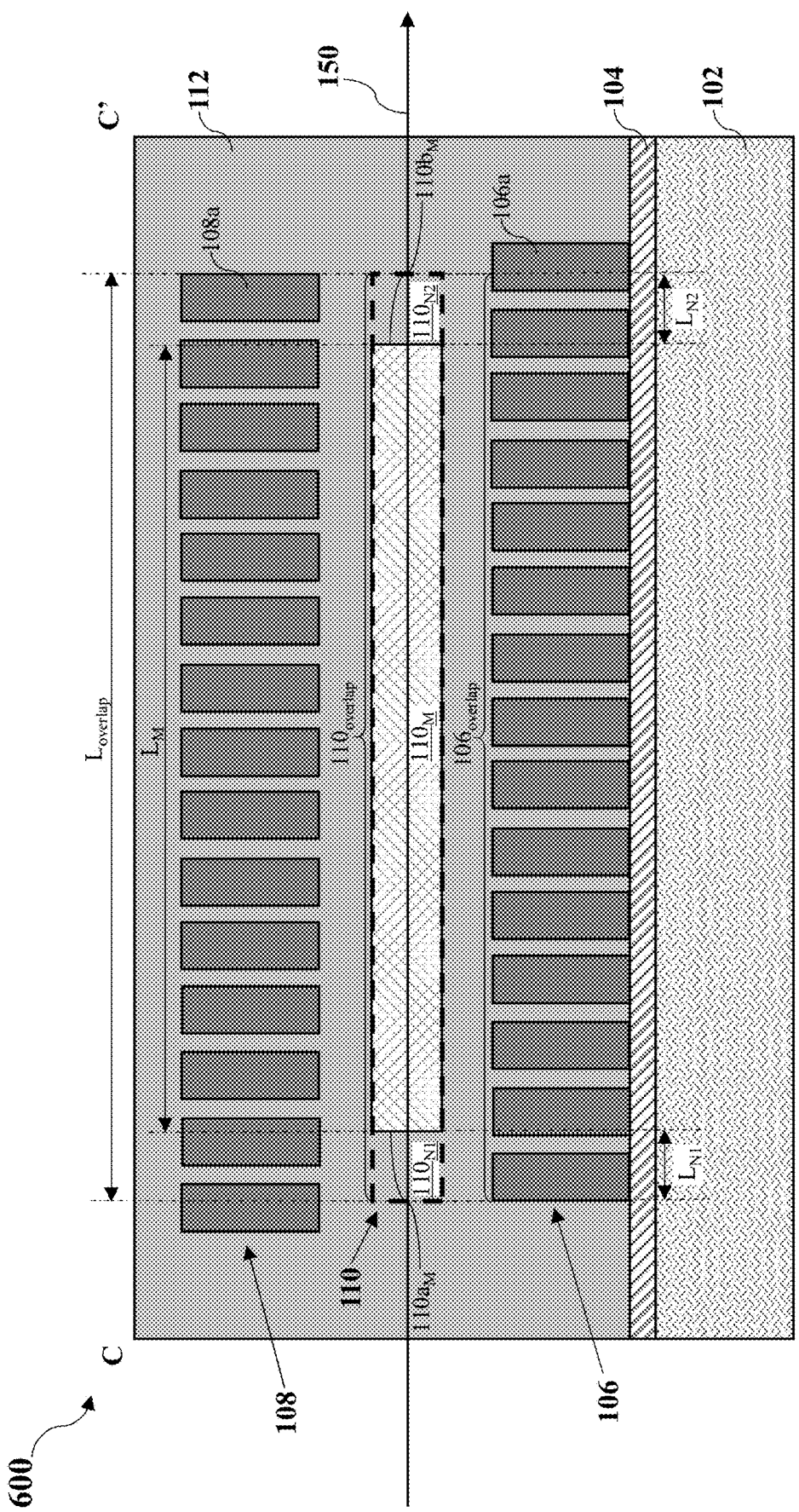

FIG. 6A shows a simplified top view of an inductive device 600 according to alternative non-limiting embodiments, and FIG. 6B shows a simplified cross-sectional view of the inductive device 600 along the line C-C' in FIG. 6A. The inductive device 600 may be similar to the inductive device 100, and thus, the common features are labelled with the same reference numerals and need not be discussed.

As shown in FIG. 6B, similar to the inductive device 100, the inductive device 600 may also include a magnetic core 110 with a portion $110_{overlap}$ extending laterally along the first axis 150 and fully overlapping with an entire length $L_{overlap}$ of the first winding layer's 106 overlap segment $106_{overlap}$ (in other words, entirely over the first winding layer 106 and entirely under the second winding layer 108). However, the portion $110_{overlap}$ in the inductive device 600 may include two non-magnetic segments (first and second non-magnetic segments $110_{N1}$, $110_{N2}$) at respective ends of the portion $110_{overlap}$ and a magnetic segment $110_M$ arranged laterally therebetween. As shown in FIG. 6B, a length $L_M$ of the magnetic segment $110_M$ may be greater than a length $L_{N1}$ of the first non-magnetic segment $110_{N1}$ and may also be greater than a length $L_{N2}$ of the second non-magnetic segment $110_{N2}$. For example, the length $L_M$ of the magnetic segment $110_M$ may range from about 100 μm to about 2 mm. Similarly, the length $L_M$ may be adjusted to vary the inductance density and saturation current of the inductive device 600. When the inductive device 600 is used to form a coupled inductor, the length $L_M$ may be less than 20% of the length $L_{overlap}$ and the magnetic segment $110_M$ may be arranged under the uncoupled turns, so as to obtain an acceptable trade-off between the coupling coefficient K, the inductance density and the saturation current of the coupled inductor. The length $L_{N1}$ of the first non-magnetic segment $110_{N1}$ and the length $L_{N2}$ of the second non-magnetic segment $110_{N2}$ may be approximately equal, and may each range from about 20 um to about 40 um. The lengths $L_{N1}$, $L_{N2}$ may each be about 30 um in a non-limiting embodiment.

Further, the magnetic segment $110_M$ may include a first side surface $110a_M$ and a second side surface $110b_M$, where both of these side surfaces $110a_M$, $110b_M$ may be substantially perpendicular to the first axis 150.

The inductive devices 500, 600 may be fabricated using methods similar to the method illustrated with reference to FIGS. 2A to 2F or methods similar to the method illustrated with reference to FIGS. 4A to 4E. Such methods of fabrication allow the non-magnetic segments $110_{N1}$, $110_{N2}$, $110_N$ in the magnetic core 110 to be formed when forming a portion of the second insulating layer 112, hence simplifying the fabrication processes. In the resulting inductive devices 100, 300, 500, 600, the non-magnetic segments $110_{N1}$, $110_{N2}$, $110_N$ and the second insulating layer 112 may thus have a same material composition. However, the inductive devices 100, 300, 500, 600 may be fabricated using other methods as known to those skilled in the art, where the non-magnetic segments $110_{N1}$, $110_{N2}$, $110_N$ and the second insulating layer 112 may instead have different material compositions.

The number of magnetic segments and non-magnetic segments may differ from that in the inductive devices 100, 300, 500, 600 described above. For example, the portion $110_{overlap}$ of the magnetic core 110 may alternatively include only a single magnetic segment and a single non-magnetic segment arranged laterally adjacent to each other along the first axis 150. Further, the lengths of the magnetic and non-magnetic segments $110_{M1}$, $110_{M2}$, $110_{M3}$, $110_{N1}$, $110_{N2}$, $110_N$ may differ from that described above. For example, in the inductive device 500, the lengths $L_{M1}$, $L_{M2}$ of the magnetic segments $110_{M1}$, $110_{M2}$ may be different and accordingly, the non-magnetic segment $110_N$ may not overlap vertically with approximately a middle of the overlap segment $106_{overlap}$. In addition, the magnetic elements 1101, 1102 in the inductive devices 100, 300, 500 need not extend laterally beyond the overlap segment $106_{overlap}$ of the first winding layer 106. In other words, each of the magnetic segments ($110_{M1}$, $110_{M3}$ in the inductive devices 100, 300 or $110_{M1}$, $110_{M2}$ in the inductive device 500) may include the entire respective magnetic element 1101, 1102.

As mentioned above, in each of the inductive devices 100, 300, 500, 600, the winding layers 106, 108 and the connectors 107 connecting these layers 106, 108 may form a plurality of turns around a first axis 150. By applying a current through the turns, a flux flow may be induced in the magnetic core 110 in the direction along the first axis 150. As mentioned above, the magnetic core 110 may include at least one non-magnetic segment $110_{N1}$, $110_{N2}$, $110_N$ and at least one magnetic segment $110_{M1}$, $110_{M2}$, $110_{M3}$ arranged laterally adjacent to each other along the first axis 150. Such a magnetic core 110 may be considered as being segmented orthogonal to the flux flow direction. Providing this segmented magnetic core 110 may form a high reluctance path in the core 110 and disrupt the flux flow along the first axis 150. This can help reduce magnetic core saturation and in turn, the saturation current of the inductive device 100, 300, 500, 600 may increase (while maintaining the size of the inductive device 100, 300, 500, 600). Thus, the inductive devices 100, 300, 500, 600 may have an improved current handling capacity and may be used to replace existing on-board magnetic inductive devices in DC-DC convertors operating in a low frequency range, as well as existing non-magnetic inductive devices in IVRs operating in a high frequency range. For example, the inductive devices 100, 300, 500, 600 may be used as on-chip magnetic inductive devices in IVRs with high operating currents.

The lengths $L_{N1}$, $L_{N2}$, $L_N$ of the inductive devices 100, 300, 500, 600 may affect the performance of these devices 100, 300, 500, 600. For example, increasing these lengths $L_{N1}$, $L_{N2}$, $L_N$ may increase the saturation currents of the devices 100, 300, 500, 600, but may also increase the losses of the devices 100, 300, 500, 600. Depending on the fabrication processes of the devices 100, 300, 500, the lengths $L_{N1}$, $L_{N2}$, $L_N$ may be limited by etch resolution capabilities. On the other hand, since the non-magnetic segments $110_{N1}$, $110_{N2}$ may be arranged at the ends of the magnetic core's 110 overlap portion $110_{overlap}$, the lengths $L_{N1}$, $L_{N2}$ in the inductive device 600 may not be limited by etch resolution capabilities and may thus be varied over a larger range.

Figure 7:
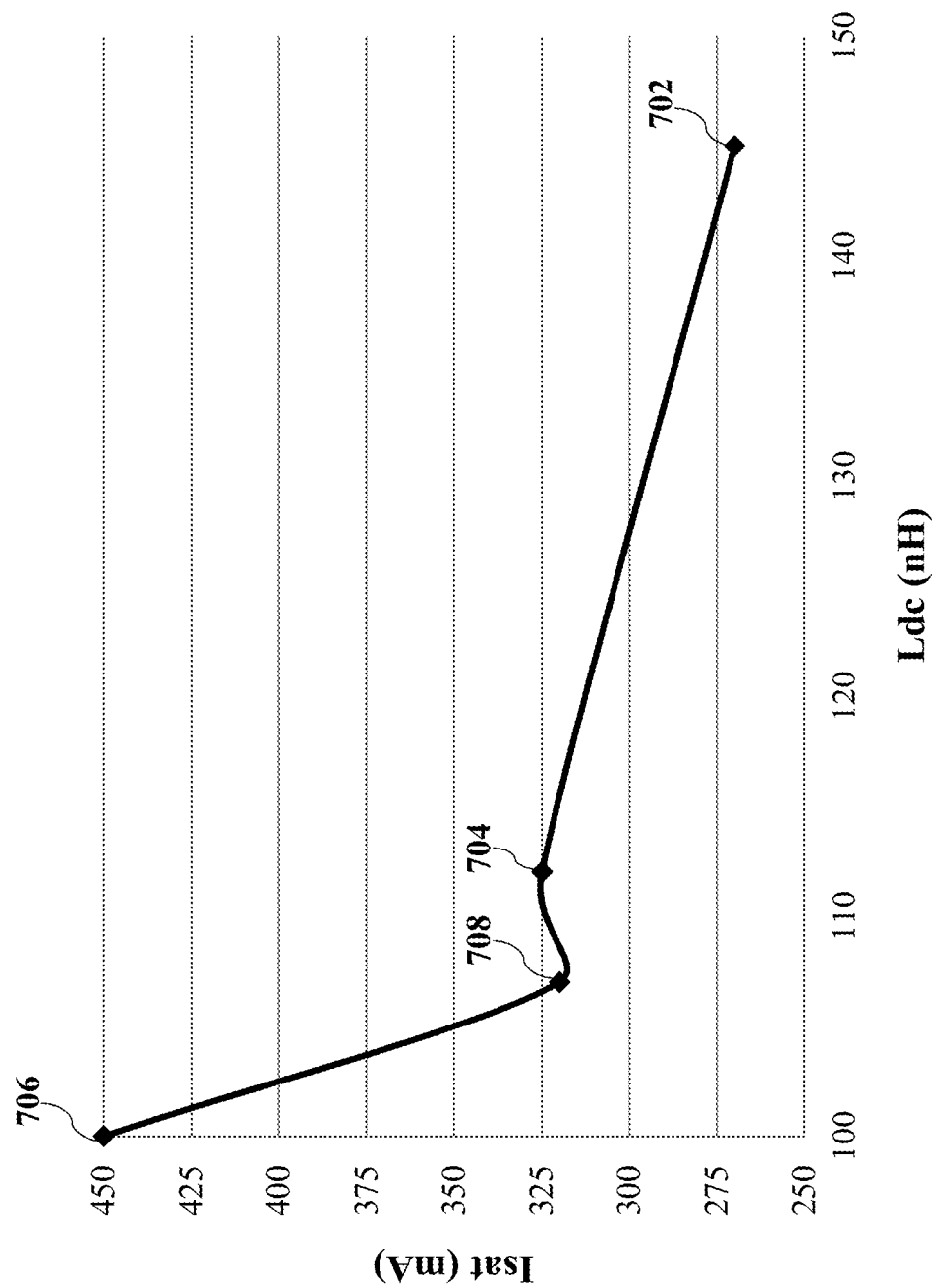
FIG. 7 shows a simulated plot illustrating how a saturation current and an inductance of an inductive device change as a structure of a magnetic core in the inductive device changes.

FIG. 7 shows a simulated plot illustrating how a saturation current Isat and an inductance Ldc of an inductive device may change as the structure of the magnetic core 110 in the device changes. In FIG. 7, the point 702 corresponds to a prior art inductive device similar to the devices 100, 300, 500, 600, except that the magnetic core 110 has a continuous magnetic segment fully overlapping with the entire length $L_{overlap}$ of the first winding layer's 106 overlap segment $106_{overlap}$. The points 704, 706, 708 correspond to the inductive devices 100, 500, 600 respectively.

As shown in FIG. 7, each of the inductive devices 100, 500, 600 may have a lower inductance Ldc than the prior art device. However, each of these devices 100, 500, 600 may have a higher saturation current Isat than the prior art device. Further, among the inductive devices 100, 500, 600, the inductive device 500 may have a highest saturation current (at point 706) and the inductive device 600 may have a lowest saturation current (at point 708). However, the inductive device 500 may have a lowest inductance (at point 706) and the inductive device 100 may have a highest inductance (at point 704). Accordingly, the saturation current Isat and the inductance Ldc of an inductive device may be adjusted by varying the structure (e.g. varying the length, number and arrangement of magnetic and non-magnetic segments) of its magnetic core 110.

Figure 8:
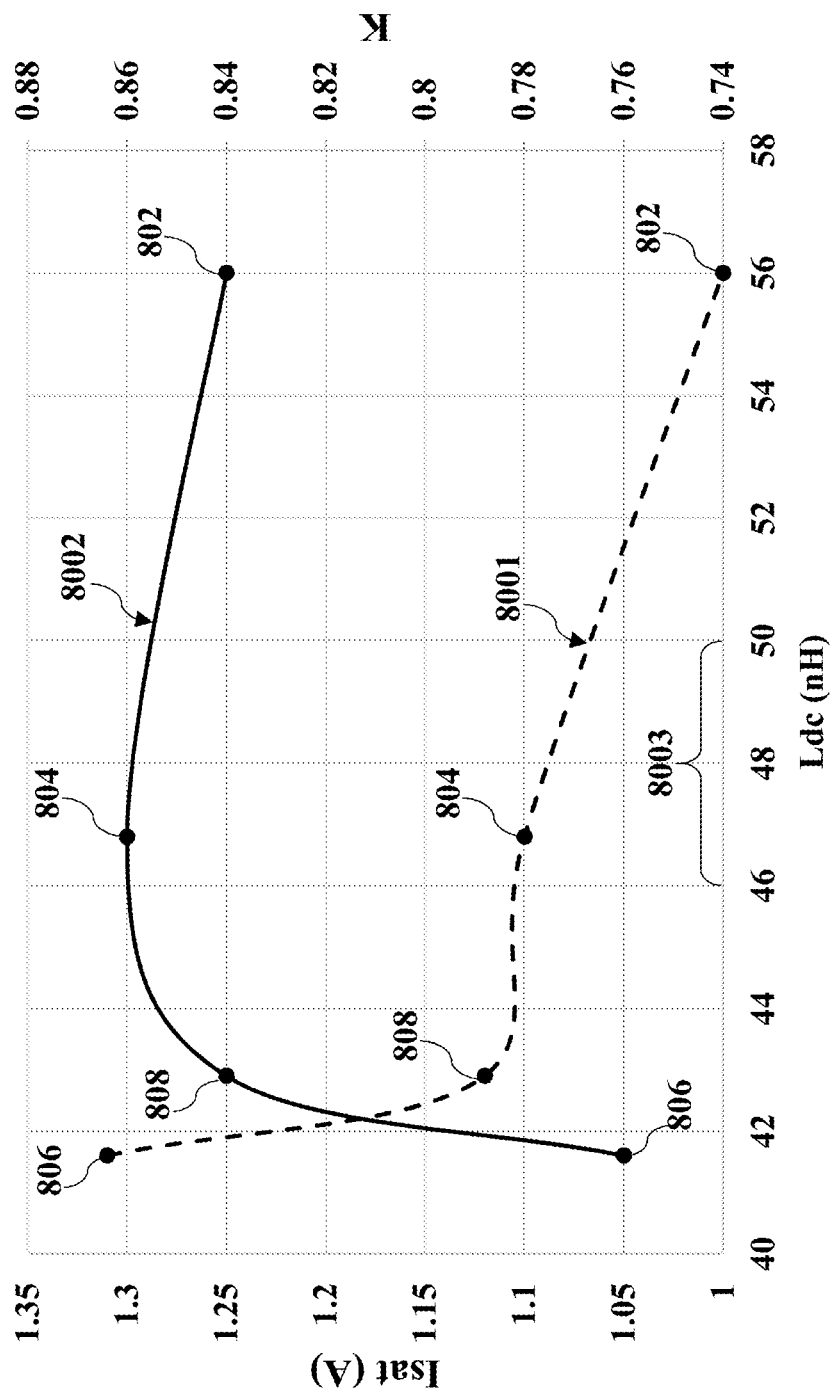
FIG. 8 shows simulated plots illustrating how a saturation current and a coupling coefficient of a coupled inductor change as a structure of a magnetic core in an inductive device used to form the coupled inductor changes.

The inductive devices 100, 300, 500, 600 may be used for forming coupled inductors. FIG. 8 shows a first simulated plot 8001 and a second simulated plot 8002 respectively illustrating how a saturation current Isat and a coupling coefficient K of a coupled inductor change, as the structure of the magnetic core 110 in the inductive device used to form the coupled inductor changes. In FIG. 8, the points 802 correspond to a coupled inductor formed with a prior art inductive device similar to that described above with reference to FIG. 7. The points 804 correspond to a coupled inductor formed with the inductive device 100, the points 806 correspond to a coupled inductor formed with the inductive device 500 and the points 808 correspond to a coupled inductor formed with the inductive device 600.

Referring to the simulated plot 8001, the coupled inductor formed with the prior art device may have a lower saturation current Isat as compared to the other coupled inductors. Further, among the coupled inductors formed with the devices 100, 500, 600, the coupled inductor formed with the device 500 may have a highest saturation current Isat (at point 806) and the coupled inductor formed with the device 100 may have a lowest saturation current (at point 804). Referring to the simulated plot 8002, the coupled inductors formed with the inductive device 600 and with the prior art device may have approximately the same coupling coefficients K (at points 802, 808). Further, the coupled inductor formed with the inductive device 100 may have a highest coupling coefficient K (at point 804); whereas, the coupled inductor formed with the inductive device 500 may have a lowest coupling coefficient K (at point 806). Accordingly, the trade off in terms of the saturation current Isat and the coupling coefficient K may be the best in the coupled inductor formed with the inductive device 100 (since such a coupled inductor may have a highest coupling coefficient K among all the coupled inductors and a higher saturation current Isat than the coupled inductor formed with the prior art device). As shown in FIG. 8, this coupled inductor may provide an inductance in the range 8003 of about 46 nH to about 50 nH.

Figure 9:
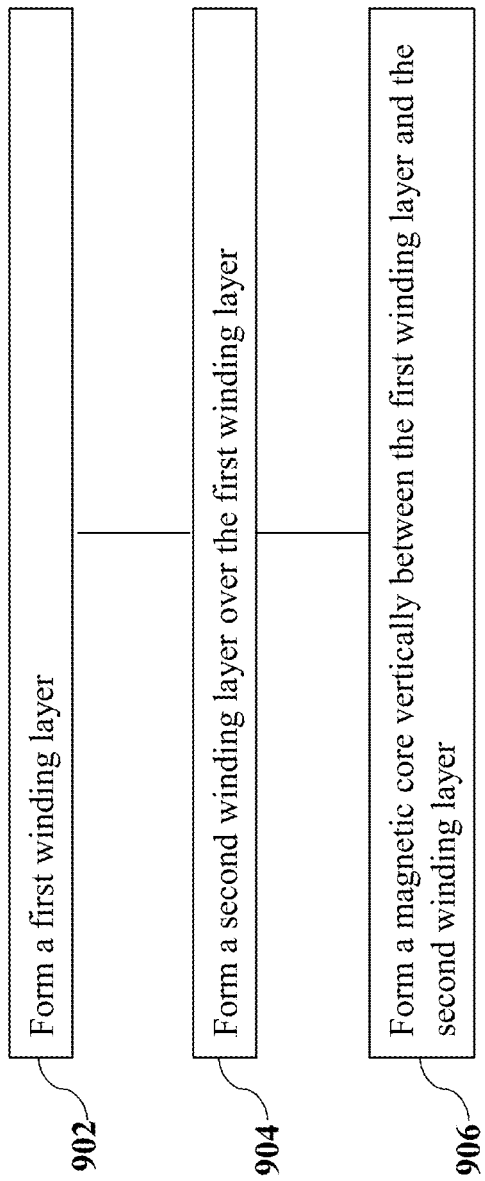
FIG. 9 shows a method of fabricating an inductive device according to various non-limiting embodiments.

FIG. 9 shows a flow diagram of a method of fabricating an inductive device according to various non-limiting embodiments.

At 902, the method may include forming a first winding layer. The first winding layer may for example, be the first winding layer 106 described above, and 902 may include the processes described with reference to FIG. 2A or FIG. 4A.

At 904, the method may include forming a second winding layer over the first winding layer, where the second winding layer may be connected to the first winding layer to form a plurality of turns around a first axis. The second winding layer may for example, be the second winding layer 108 described above, and 904 may include the processes described with reference to FIG. 2F or FIG. 4E.

At 906, the method may include forming a magnetic core vertically between the first winding layer and the second winding layer. The magnetic core may for example, be the magnetic core 110 described above, and 906 may include the processes described with reference to FIGS. 2B to 2D or FIGS. 4A to 4D.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An inductive device comprising:
 a first winding layer;
 a second winding layer arranged over the first winding layer and connected to the first winding layer to form a plurality of turns around a first axis; and
 a magnetic core arranged vertically between the first winding layer and the second winding layer, wherein the magnetic core comprises a portion extending along the first axis, the portion entirely over the first winding layer and entirely under the second winding layer;
 wherein the portion of the magnetic core comprises a first magnetic segment, a second magnetic segment and a non-magnetic,
 wherein the non-magnetic segment is arranged laterally between the first magnetic segment and the second magnetic segment along the first axis,
 wherein the non-magnetic segment separates the first magnetic segment from contacting the second magnetic segment,
 wherein the non-magnetic segment includes a first side and a second side opposite the first side, the first side slanted at a first angle relative to the first axis, the second side slanted at a second angle relative to the first axis, the first side contacts the first magnetic segment and the second side contacts the second magnetic segment, and the non-magnetic segment has a tapered shape.

2. The inductive device of claim 1, wherein a length of the first magnetic segment and a length of the second magnetic segment are approximately equal.

3. The inductive device of claim 1, wherein the first winding layer comprises an overlap segment overlapping vertically with the second winding layer; and the non-magnetic segment is arranged to overlap vertically with approximately a middle of the overlap segment of the first winding layer.

4. The inductive device of claim 1, wherein a length of each of the first magnetic segment and the second magnetic segment is greater than a length of the non-magnetic segment.

5. The inductive device of claim 1, wherein the non-magnetic segment is a first non-magnetic segment, and wherein the portion of the magnetic core further comprises a third magnetic segment and a second non-magnetic segment arranged laterally between the second magnetic segment and the third magnetic segment.

6. The inductive device of claim 5, wherein a length of the second magnetic segment is greater than a length of each of the first magnetic segment and the third magnetic segment.

7. The inductive device of claim 5, wherein a length of each of the first magnetic segment, the second magnetic segment, and the third magnetic segment is greater than a length of each of the first non-magnetic segment and the second non-magnetic segment.

8. The inductive device of claim 1, wherein the non-magnetic segment is a first non-magnetic segment, and the portion of the magnetic core further comprises a second non-magnetic segment; and
 wherein the second magnetic segment is arranged laterally between the first non-magnetic segment and the second non-magnetic segment.

9. The inductive device of claim 8, wherein a length of the second magnetic segment is greater than a length of each of the first non-magnetic segment and the second non-magnetic segment.

10. The inductive device of claim 1, wherein the portion of the magnetic core comprises a third magnetic segment, and wherein the first magnetic segment and the third magnetic segment are arranged at respective ends of the portion of the magnetic core along the first axis.

11. The inductive device of claim 10, wherein each of the first magnetic segment and the third magnetic segment comprises a part of a magnetic element extending laterally beyond the portion of the magnetic core.

12. The inductive device of claim 10, wherein each of the first magnetic segment and the third magnetic segment comprises at least a part of a magnetic element including a first side surface and a second side surface opposite to the first side surface;
 wherein the first side surface is slanted at an angle relative to the first axis and the second side surface is substantially perpendicular to the first axis.

13. The inductive device of claim 10, wherein each of the first magnetic segment and the third magnetic segment comprises at least a part of a magnetic element including a first side surface and a second side surface opposite to the first side surface;
 wherein each of the first side surface and the second side surface is slanted at an angle relative to the first axis so that the magnetic element has a trapezoidal shape.

14. The inductive device of claim 1, wherein the inductive device further comprises an insulating layer within which the first winding layer, the second winding layer, and the magnetic core are arranged; and
  wherein the non-magnetic segment of the portion of the magnetic core and the insulating layer comprise a same material composition.

15. The inductive device of claim 1, wherein each of the first magnetic segment and the second magnetic segment comprises a part of a magnetic element extending laterally beyond the portion of the magnetic core.

16. The inductive device of claim 1, wherein each of the first magnetic segment and the second magnetic segment comprises at least a part of a magnetic element including a first side surface and a second side surface opposite to the first side surface;
  wherein the first side surface is slanted at an angle relative to the first axis and the second side surface is substantially perpendicular to the first axis.

* * * * *